United States Patent
Suzuki et al.

(10) Patent No.: US 12,082,118 B2
(45) Date of Patent: Sep. 3, 2024

(54) BATTERY MONITORING DEVICE AND BATTERY MONITORING METHOD

(71) Applicant: Hitachi Astemo, Ltd., Hitachinaka (JP)

(72) Inventors: Jun Suzuki, Utsunomiya (JP); Tsuyoshi Takaku, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 228 days.

(21) Appl. No.: 17/531,958

(22) Filed: Nov. 22, 2021

(65) Prior Publication Data

US 2022/0167275 A1 May 26, 2022

(30) Foreign Application Priority Data

Nov. 25, 2020 (JP) ................................ 2020-195419

(51) Int. Cl.
    *G01R 31/3835* (2019.01)
    *G01R 31/371* (2019.01)
    *H04W 52/02* (2009.01)

(52) U.S. Cl.
    CPC ...... *H04W 52/0261* (2013.01); *G01R 31/371* (2019.01); *G01R 31/3835* (2019.01)

(58) Field of Classification Search
    CPC .... G01R 31/371; G01R 31/3835; H04Q 9/00; H04W 52/0261; Y02D 30/70
    USPC ....................................................... 455/574
    See application file for complete search history.

(56) References Cited

U.S. PATENT DOCUMENTS

| | | | |
|---|---|---|---|
| 2002/0163339 A1* | 11/2002 | Friel | G01R 31/396 340/545.5 |
| 2006/0253735 A1 | 11/2006 | Kwak et al. | |
| 2015/0194827 A1* | 7/2015 | Sakagami | H02J 7/0049 320/149 |
| 2016/0139208 A1* | 5/2016 | Tsuruta | G01R 31/371 324/426 |
| 2019/0242949 A1 | 8/2019 | Lemkin et al. | |

(Continued)

FOREIGN PATENT DOCUMENTS

| | | |
|---|---|---|
| EP | 1509050 A1 | 2/2005 |
| JP | 3811491 B2 | 6/2006 |

(Continued)

OTHER PUBLICATIONS

JPO Notice of Reasons for Refusal for corresponding JP Application No. 2020-195419; Issued Mar. 19, 2024; 11 pages.

*Primary Examiner* — Tan H Trinh
(74) *Attorney, Agent, or Firm* — CANTOR COLBURN LLP (57) ABSTRACT

A battery monitoring device includes: a plurality of charged state acquisition units that are provided with respective ones of a plurality of battery modules, acquire charging information of the plurality of battery modules, and are capable of forming an information transmission path for the charging information through radio communication therebetween; a monitoring unit that monitors the plurality of battery modules on the basis of the charging information input via the information transmission path; and a path selection unit that selects a charged state acquisition unit forming the information transmission path to the monitoring unit for each of the plurality of charged state acquisition units capable of forming the information transmission paths on the basis of the charging information.

8 Claims, 7 Drawing Sheets

(56) References Cited

U.S. PATENT DOCUMENTS

| | | | | |
|---|---|---|---|---|
| 2020/0003842 A1* | 1/2020 | Nishikawa | ............ | H01M 10/425 |
| 2020/0215930 A1* | 7/2020 | Izumi | ....................... | B60R 16/02 |
| 2020/0412146 A1* | 12/2020 | Takechi | ................... | H02J 7/005 |
| 2021/0190876 A1* | 6/2021 | Takechi | .............. | G01R 31/3842 |
| 2021/0325468 A1* | 10/2021 | Kataoka | .............. | H01M 10/052 |
| 2022/0255144 A1* | 8/2022 | Okano | .................... | B60L 53/65 |

FOREIGN PATENT DOCUMENTS

| | | |
|---|---|---|
| JP | 2008533848 A | 8/2008 |
| JP | 2012015897 A | 1/2012 |
| JP | 2014175735 A | 9/2014 |
| JP | 2015104100 A | 6/2015 |
| JP | 2018110332 A | 7/2018 |
| JP | 2019126018 A | 7/2019 |
| JP | 2019527528 A | 9/2019 |
| JP | 2020053176 A | 4/2020 |

* cited by examiner

BATTERY MONITORING DEVICE AND BATTERY MONITORING METHOD

CROSS-REFERENCE TO RELATED APPLICATION

The present invention claims priority under 35 U.S.C. § 119 to Japanese Patent Application No. 2020-195419, filed Nov. 25, 2020, the entire content of which is incorporated herein by reference.

BACKGROUND

Field of the Invention

The present invention relates to a battery monitoring device and a battery monitoring method.

Description of Related Art

For example, Japanese Unexamined Patent Application, First Publication No. 2020-53176 discloses a battery monitoring system in which detection results or the like of voltage detection units connected to battery modules are transmitted from subordinate devices provided together with the battery modules to a host device connected to a central monitoring unit through radio communication. In such a battery monitoring system, radio communication is performed using electricity of battery modules. On the other hand, Japanese Unexamined Patent Application, First Publication No. 2019-126018 discloses a constitution for forming a mesh network through radio communication between a plurality of radio communication terminals mounted in a vehicle.

A plurality of battery modules are mounted in a vehicle, and voltage detection devices are provided for each of the battery modules. For this reason, for example, it is conceivable that states of battery modules be transmitted to a monitoring unit by enabling voltage detection devices to perform radio communication therebetween and forming a mesh network including the monitoring unit.

However, when a mesh network is formed, information is generally transmitted to a monitoring unit via a path having the most favorable communication state, but charged states of battery modules have not been taken into consideration. For this reason, there is a probability that a bias will occur in paths used for communication and the electricity consumption of battery modules on some paths will become larger than that of battery modules which are not on these paths. As a result, it is conceivable that a bias may occur among charge amounts of a plurality of battery modules.

The present invention has been made in consideration of the problems described above, and an object thereof is to be able to form information transmission paths based on charged states of battery modules in a battery monitoring device and a battery monitoring method in which a mesh network is formed and information of the battery modules is transmitted to a monitoring unit.

SUMMARY OF THE INVENTION

The present invention employs the following aspects as means for resolving the foregoing problems.

According to a first aspect, there is provided a battery monitoring device including charged state acquisition units that are provided with respective ones of a plurality of battery modules, acquire charging information of the plurality of battery modules, and are capable of forming an information transmission path for the charging information through radio communication therebetween; a monitoring unit that monitors the plurality of battery modules on the basis of the charging information input via the information transmission path; and a path selection unit that selects a charged state acquisition unit forming the information transmission path to the monitoring unit for each of the plurality of charged state acquisition units capable of forming the information transmission paths on the basis of the charging information.

According to a second aspect, in the first aspect of the battery monitoring device, when the path selection unit selects the charged state acquisition unit forming the information transmission path such that a charged state acquisition unit connected to a battery module having a charge amount smaller than a threshold set in advance among the plurality of battery modules each of which is connected to the charged state acquisition unit forming the information transmission path is excluded.

According to a third aspect, in the first or second aspect of the battery monitoring device, the path selection unit selects the charged state acquisition unit forming the information transmission path such that the number of the plurality of the charged state acquisition units forming the information transmission path becomes an upper limit number set in advance or smaller.

According to a fourth aspect, in any one of the first to third aspects of the battery monitoring device, when there is a battery module having a charge amount smaller than a threshold set in advance among the plurality of battery modules each of which connected to the charged state acquisition unit forming the information transmission path, the monitoring unit reduces a communication frequency of the radio communication via the information transmission path compared to a case in which the charge amount of the battery module is larger than the threshold set in advance.

According to a fifth aspect, in any one of the first to fourth aspects of the battery monitoring device, before the charged state acquisition units forming the information transmission path to the monitoring unit is selected on the basis of the charging information, the path selection unit selects the charged state acquisition units forming the information transmission path on the basis of an electric field intensity of the radio communication between the plurality of charged state acquisition units capable of forming the information transmission path.

According to a sixth aspect, there is provided a battery monitoring method for forming an information transmission path from each of a plurality of charged state acquisition units to a monitoring unit for monitoring a plurality of battery modules through radio communication between the plurality of charged state acquisition units provided with respective ones of a plurality of battery modules. The battery monitoring method includes acquiring charging information of the plurality of battery modules, and selecting a charged state acquisition unit forming the information transmission path for each of the plurality of charged state acquisition units on the basis of the charging information.

In the present invention, a mesh network for connecting each of the charged state acquisition units and the monitoring unit to each other is formed through radio communication between the charged state acquisition units. In addition, in the present invention, charged state acquisition units forming information transmission paths from each of the charged state acquisition units to the monitoring unit is selected on the basis of the charged state of the battery module acquired by the charged state acquisition unit.

Namely, according to the present invention, information transmission paths can be formed in consideration of the charged states of the battery modules. For example, information transmission paths can be formed such that no bias occurs in the charge amounts of the battery modules. In this manner, according to the present invention, information transmission paths can be formed on the basis of the charged states of the battery modules in the battery monitoring device and the battery monitoring method in which a mesh network is formed and information of the battery modules is transmitted to the monitoring unit.

DETAILED DESCRIPTION OF THE INVENTION

Hereinafter, with reference to the drawings, embodiments of a battery monitoring device and a battery monitoring method according to the present invention will be described.

First Embodiment

Figure 1:
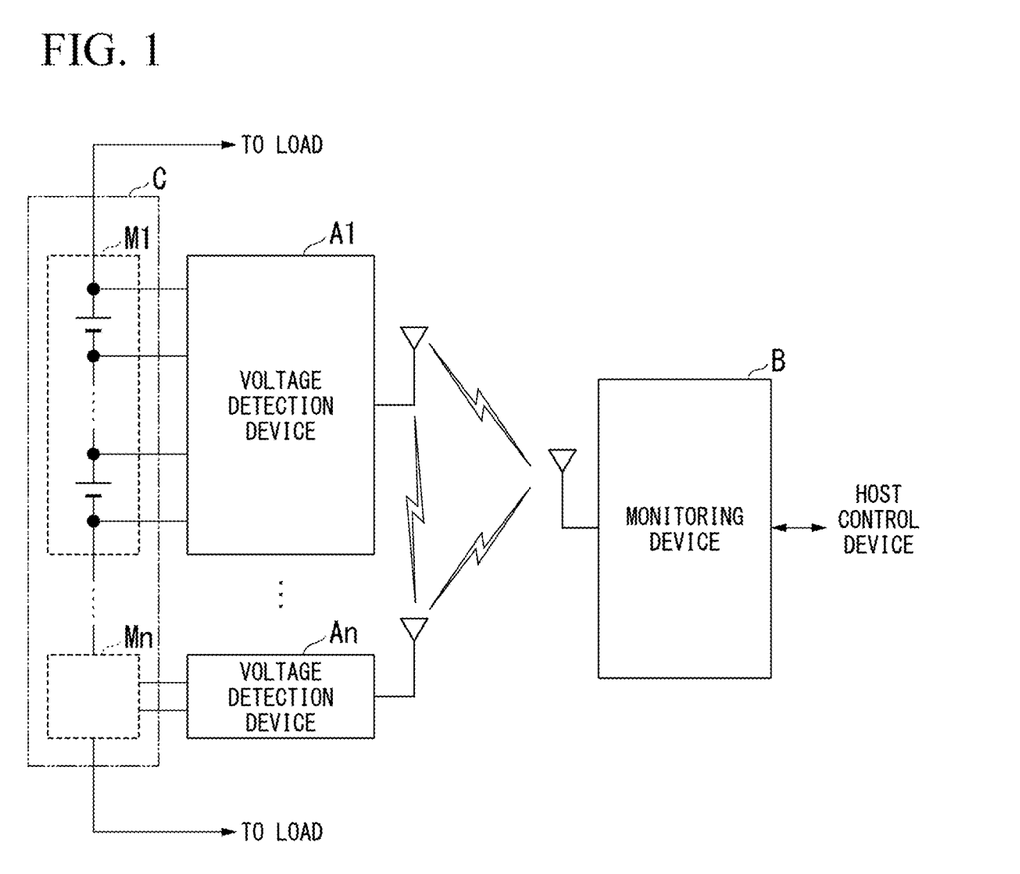
FIG. 1 is a block diagram showing a schematic constitution of a battery monitoring system according to a first embodiment of the present invention.

FIG. 1 is a block diagram showing a schematic constitution of a battery monitoring system (i.e., battery monitoring device) of the present first embodiment. As shown in this diagram, the battery monitoring system of the present embodiment includes a plurality of voltage detection devices A1 to An (i.e., charged state acquisition units) and a single monitoring device B (i.e., monitoring unit). The voltage detection devices A1 to An and the monitoring device B are connected to each other such that radio communication can be performed through predetermined radio lines. According to the present embodiment, "n" is a prefix or a suffix indicating an arbitrary natural number.

A monitoring target of such a battery monitoring system is an assembled battery C including n battery modules M1 to Mn. The n battery modules M1 to Mn include a plurality of (m) battery cells connected to each other in series and have the total voltage of the battery cells as an output voltage. Such n battery modules M1 to Mn are connected to each other in series. That is, the assembled battery C which is the monitoring target of the present embodiment is a secondary battery having the total voltage of then battery modules M1 to Mn, namely, the total voltage of n×m battery cells as an output voltage.

According to the present embodiment, the assembled battery C is mounted in an electrically driven vehicle such as an electric car or a hybrid car and supplies DC power to a travelling motor (i.e., load) that is a travelling power source, for example. Such an assembled battery C is a lithium-ion battery or a fuel cell, for example, and outputs an output voltage of hundreds of volts.

A plurality of (n) voltage detection devices A1 to An are provided in a manner corresponding to the n battery modules M1 to Mn. That is, a plurality of (n) voltage detection devices A1 to An are provided in a manner corresponding to the battery modules M1 to Mn. That is, the plurality of (n) voltage detection devices A1 to An are provided with respective ones of the plurality of (n) battery modules M1 to Mn. These voltage detection devices A1 to An form a mesh network together with the monitoring device B through radio communication therebetween, detect voltages (i.e., voltages of respective cells) of the respective battery modules M1 to Mn corresponding thereto, and wirelessly transmit their voltage detection values (i.e., voltage information) together with identification numbers thereof to the monitoring device B via the mesh network.

The output voltages of the battery modules M1 to Mn vary depending on charge amounts of the battery modules M1 to Mn. The charge amount of each of the battery modules M1 to Mn is calculated as a SOC (i.e., a state of charge) in the monitoring device B, for example, on the basis of voltage information (i.e., charging information) acquired by the voltage detection devices A1 to An. That is, numerical values of the charge amounts of the battery modules M1 to Mn are calculated in the monitoring device B, but the voltage information (i.e., charging information) indicating the charge amount is acquired and output by each of the voltage detection devices A1 to An.

The single monitoring device B monitors the state of the assembled battery C on the basis of a cell voltage detection value of each of the battery modules M1 to Mn received wirelessly from each of the voltage detection devices A1 to An. This monitoring device B successively reports monitoring results of the assembled battery C to a host control device that is not shown.

The voltage detection devices A1 to An and the monitoring device B will be described in more detail with reference to FIG. 2. The n voltage detection devices A1 to An have individual identification numbers for identifying themselves. However, the n voltage detection devices A1 to An have the same basic constitutions. Therefore, hereinafter, a detailed constitution of the first voltage detection device A1 will be representatively described.

Figure 2:
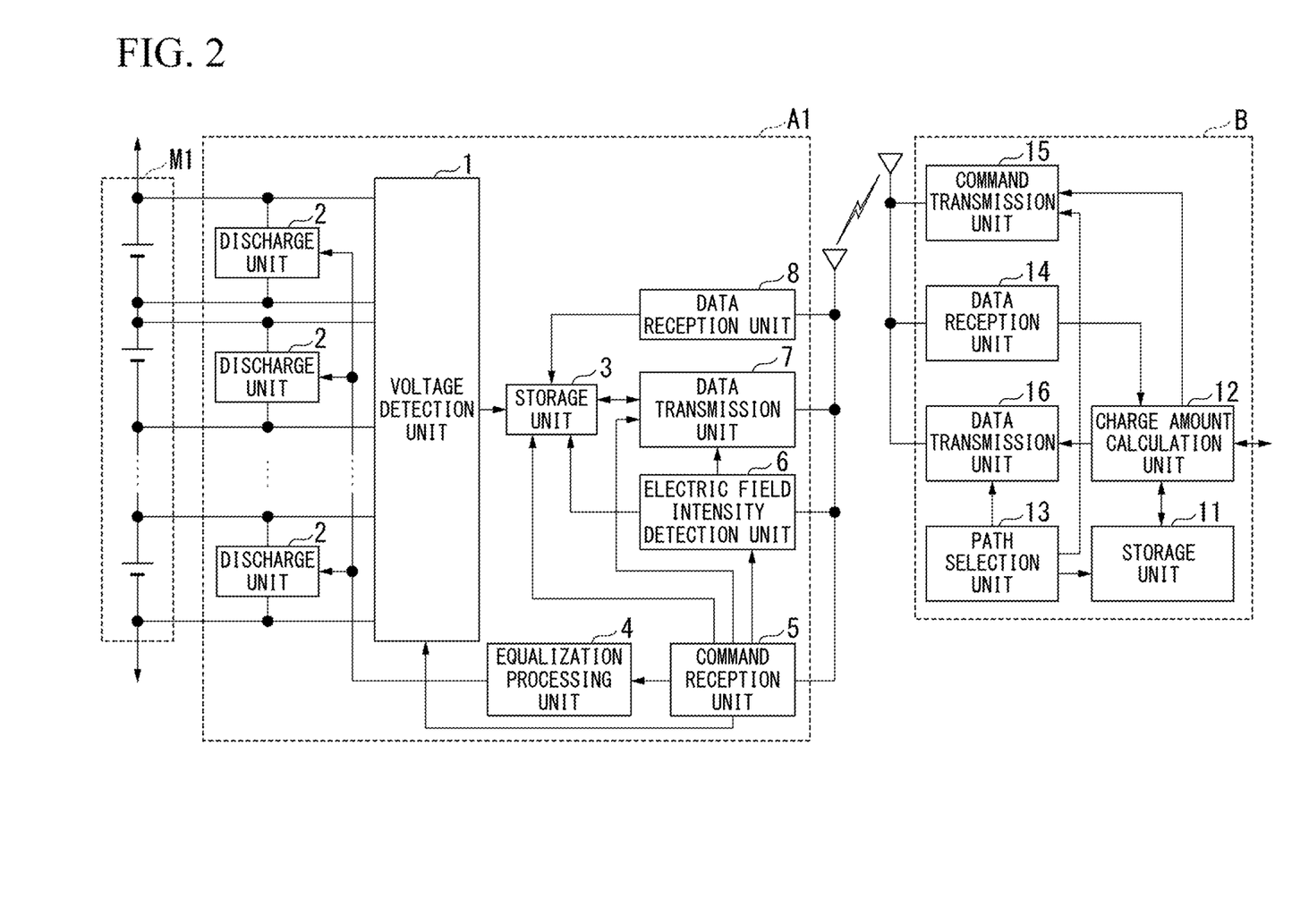
FIG. 2 is a detailed block diagram including a voltage detection device and a monitoring device provided in the battery monitoring system according to the first embodiment of the present invention.

FIG. 2 is a detailed block diagram including a voltage detection device and a monitoring device provided in the battery monitoring system according to the present embodiment. As shown in this diagram, the first voltage detection device A1 includes a voltage detection unit 1, a plurality of (m) discharge units 2, a storage unit 3, an equalization processing unit 4, a command reception unit 5, an electric field intensity detection unit 6, a data transmission unit 7, and a data reception unit 8.

The voltage detection unit 1 is a main functioning unit of the first voltage detection device A1, detects the output voltages (i.e., cell voltages) of the m battery cells constituting the first battery module M1, and outputs detection values (i.e., cell voltage detection values) of the m cell voltages to the storage unit 3. As illustrated, electrodes (i.e., positive electrode and negative electrode) of each battery cell in the first battery module M1 are connected to respective ones of a plurality of input ends of the voltage detection unit 1, and the voltage detection unit 1 acquires the cell voltage detection value of each battery cell on the basis of the difference between a potential of the positive electrode and a potential of the negative electrode of each battery cell.

The voltage detection unit 1 detects cell voltages which are analog values by sampling the potential of the positive electrode and the potential of the negative electrode of each battery cell at predetermined time intervals. In addition, this voltage detection unit 1 converts the cell voltages of each battery cell into digital values in a predetermined resolution, and sequentially outputs the cell voltages that are digital values to the storage unit 3 as the cell voltage detection values.

As described above, the n battery modules M1 to Mn are secondary batteries and can perform discharging and charging. The plurality of (m) discharge units 2 are provided in the respective battery cells for equalization of charged states of the m battery cells in the first battery module M1. Each of the plurality of (m) discharge units 2 is a series circuit including an electronic switch and a resistor.

These discharge units 2 are constituted of an electronic switch such as a switching transistor having an on-state and an off-state operated by the equalization processing unit 4, and a resistor which is connected to the electronic switch in series and has a predetermined resistance. In the electronic switch of the discharge unit 2 corresponding to each battery cell, the on-state and an off-state for equalizing the m battery cells (i.e., charged states of the m battery cells) are set by the equalization processing unit 4.

The storage unit 3 stores the cell voltage detection values input from the voltage detection unit 1. For example, such a storage unit 3 is a semiconductor memory functioning as a ring buffer. In addition, this storage unit 3 stores selection commands input through the command reception unit 5 from the monitoring device B. In addition, these selection commands will be described below. In addition, the storage unit 3 stores electric field intensity values input from the electric field intensity detection unit 6. These electric field intensity values are values indicating the electric field intensities when the first voltage detection device A1 directly performs radio communication with other voltage detection devices A2 to An or the monitoring device B, and the electric field intensity values are acquired by the electric field intensity detection unit 6.

The equalization processing unit 4 is an operation unit for operating the m discharge units 2 on the basis of operation commands input through the command reception unit 5. That is, when an equalization processing command for each battery cell of the first battery module M1 is input through the command reception unit 5, this equalization processing unit 4 equalizes each cell voltage by turning on or turning off each of the electronic switches in the m discharge units 2.

For example, in the m battery cells which are connected to each other in series in the first battery module M1, when the cell voltage of a certain battery cell is a voltage higher than the cell voltages of other battery cells, the equalization processing unit 4 forcibly discharges the battery cell having the high cell voltage by setting only the electronic switch of the discharge unit 2 connected in parallel to the battery cell having the high cell voltage to an on-state. As a result, the cell voltage of the foregoing certain battery cell falls, and the cell voltage of the foregoing certain battery cell is equalized with the cell voltages of other battery cells.

The command reception unit 5 is a communication unit for wirelessly receiving equalization processing commands, voltage transmission commands, or electric field intensity transmission commands from the monitoring device B. As illustrated, the command reception unit 5 includes an antenna. The command reception unit 5 receives radio waves propagated from the monitoring device B via the mesh network using the antenna, and extracts an equalization processing command, a voltage transmission command, or an electric field intensity transmission command included in the radio waves (i.e., received waves). When an equalization processing command, a voltage transmission command, or an electric field intensity transmission command is extracted from received waves, such a command reception unit 5 outputs an equalization processing command to the equalization processing unit 4, outputs a voltage transmission command to the voltage detection unit 1 and the data transmission unit 7, and outputs an electric field intensity transmission command to the electric field intensity detection unit 6 and the data transmission unit 7.

In addition, in the present embodiment, the command reception unit 5 wirelessly receives a selection command from the monitoring device B via the mesh network. The command reception unit 5 receives radio waves propagated from the monitoring device B via the mesh network, and when a selection command included in the radio waves (i.e., received waves) is extracted, the command reception unit 5 outputs the selection command to the storage unit 3.

The electric field intensity detection unit 6 measures the electric field intensities between the voltage detection devices A1 to An and other voltage detection devices A1 to An or the monitoring device B on the basis of an electric field intensity transmission command input through the command reception unit 5 and outputs measurement results as electric field intensity values. For example, the electric field intensity detection unit 6 measures the electric field intensity on the basis of a signal intensity transmitted and received via the antenna. When an electric field intensity transmission command is input, the electric field intensity detection unit 6 individually performs radio communication with other voltage detection devices A1 to An or the monitoring device B capable of performing radio communication. Accordingly, the electric field intensity detection unit 6 measures the electric field intensities between the voltage detection devices A1 to An and other voltage detection devices A1 to An or the monitoring device B on the basis of an electric field intensity transmission command.

The data transmission unit 7 is a communication unit for transmitting voltage information (i.e., charging information) of each battery cell, electric field intensity information (i.e., electric field intensity value), or the like acquired from the storage unit 3 to the monitoring device B. This data transmission unit 7 includes an antenna. When various kinds of transmission commands are input through the command reception unit 5, the data transmission unit 7 transmits the voltage information and/or the electric field intensity information toward the monitoring device B via the mesh network in accordance with the details of the transmission commands.

Such a data transmission unit 7 generates transmission packets individually storing the cell voltage detection value of each battery cell in the first battery module M1, the electric field intensity values between the first voltage detection device A1 and other voltage detection devices A2 to An (or the monitoring device B), and the identification number of the first voltage detection device A1. The data transmission unit 7 transmits the transmission packets subjected to predetermined modulation processing. In addition, the data transmission unit 7 transmits the transmission packets to a counterpart (i.e., other voltage detection devices A2 to An or the monitoring device B) which has been set on the basis of selection information stored in the storage unit 3.

In addition, when the first voltage detection device A1 forms at least a part of the information transmission paths for transmitting information of other voltage detection devices A2 to An to the monitoring device B, the data transmission unit 7 transmits data received from other voltage detection devices A2 (i.e., a source) to An toward the voltage detection devices A2 to An different from the source or the monitoring device B.

When the first voltage detection device A1 forms at least a part of the information transmission paths for transmitting information of other voltage detection devices A2 to An to the monitoring device B, the data reception unit 8 receives data transmitted from other voltage detection devices A2 to An (i.e., a source) or the monitoring device B (i.e., a source) to the voltage detection devices A2 to An different from the source.

Meanwhile, as shown in FIG. 2, the monitoring device B includes a storage unit 11, a charge amount calculation unit 12, a path selection unit 13, a data reception unit 14, a command transmission unit 15, and a data transmission unit 16.

For example, the storage unit 11 is a semiconductor memory functioning as a ring buffer, which stores the charge amounts of the battery modules M1 to Mn input from the charge amount calculation unit 12. In addition, the storage unit 11 stores the cell voltage detection values and the electric field intensity values input from the data reception unit 14.

The charge amount calculation unit 12 calculates (i.e., acquires) the charge amount of each of the battery modules M1 to Mn on the basis of the voltage information input from the voltage detection devices A1 to An, and stores the calculated charge amounts in the storage unit 11. In addition, as necessary, the charge amount calculation unit 12 makes an equalization command for performing equalization processing on the basis of the cell voltage detection values input from the voltage detection devices A1 to An and outputs the equalization command to the command transmission unit 15.

The path selection unit 13 selects the voltage detection devices A1 to An for forming information transmission paths from the voltage detection devices A1 to An to the monitoring device B for each of the voltage detection devices A1 to An. The path selection unit 13 selects the voltage detection devices A1 to An for forming information transmission paths on the basis of the charge amounts of the battery modules M1 to Mn stored in the storage unit 11. For example, the path selection unit 13 selects the voltage detection devices A2 to An forming information transmission paths from the first voltage detection device A1 to the monitoring device B on the basis of the charge amounts of the battery modules M1 to Mn.

In the present embodiment, when any of the battery modules M1 to Mn having a charge amount equal to or smaller than a threshold set in advance is present in the battery modules M1 to Mn to which the voltage detection devices A1 to An forming information transmission paths are connected, the path selection unit 13 selects the voltage detection devices A1 to An such that information transmission paths are formed excluding the voltage detection devices A1 to An connected to these battery modules M1 to Mn. In addition, before the voltage detection devices A1 to An forming information transmission paths are selected on the basis of the charge amounts of the battery modules M1 to Mn, the path selection unit 13 selects the voltage detection devices A1 to An forming information transmission paths on the basis of the electric field intensity values. The path selection unit 13 makes an electric field intensity transmission command and acquires the electric field intensity value in each of the voltage detection devices A1 to An. An operation of selecting information transmission paths will be described below in detail.

A timing when the path selection unit 13 performs an operation of selecting information transmission paths is not particularly limited. For example, the operation can be performed every time a command is transmitted from the monitoring device B to the voltage detection devices A1 to An. In addition, an operation of selecting a path may be performed by the path selection unit 13 at an interval of a certain period set in advance.

When the voltage detection devices A1 to An forming information transmission paths are selected, the path selection unit 13 makes a selection command indicating the selected voltage detection devices A1 to An and outputs the selection command to the command transmission unit 15. Such selection information is input from the command transmission unit 15 to each of the voltage detection devices A1 to An via the mesh network and the selection information is stored in the storage unit 3 of each of the voltage detection devices A1 to An.

A selection command includes information indicating that each of the voltage detection devices A1 to An outputs information received from other voltage detection devices A1 to An to one of the voltage detection devices A1 to An or the monitoring device B. That is, the selection command includes information indicating the voltage detection devices A1 to An or the monitoring device B to which each of the voltage detection devices A1 to An outputs information received from other voltage detection devices A1 to An. Such a selection command is stored in the storage unit 3 of each of the voltage detection devices A1 to An. In each of the voltage detection devices A1 to An, the data transmission unit 7 generates transmission packets on the basis of data or the like received by the data reception unit 8 from other voltage detection devices A1 to An and transmits the transmission packets toward the counterpart set on the basis of a selection command stored in the storage unit 3.

In addition, as necessary, the path selection unit 13 makes a voltage transmission command and an electric field intensity transmission command and outputs the voltage transmission command and the electric field intensity transmission command to the command transmission unit 15. For example, when an operation of selecting information transmission paths is performed, the path selection unit 13 acquires, as the charging information, the charge amounts of the battery modules M1 to Mn calculated by the charge amount calculation unit 12 and stored in the storage unit 11, and acquires, as the electric field intensity information, the electric field intensity values stored in the storage unit 11. At this time, when required charge amounts or electric field intensity values are not stored in the storage unit 11, the path selection unit 13 makes a voltage transmission command and an electric field intensity transmission command, and transmits the cell voltage detection values or the electric field intensity values to the voltage detection devices A1 to An via the command transmission unit 15.

The data reception unit 14 is a communication unit for wirelessly receiving the voltage detection value (i.e., cell voltage detection value), the electric field intensity value, and the like of each battery cell from the data transmission unit 7 described above. As illustrated, this data reception unit 14 includes an antenna for communication. Thereby, the data reception unit 14 receives radio waves propagated from each of the voltage detection devices A1 to An using the antenna for communication. Such a data reception unit 14 outputs the voltage detection value and the electric field intensity value of each battery cell received from the data transmission unit 7 of each of the voltage detection devices A1 to An to the storage unit 11.

The command transmission unit 15 is a communication unit for wirelessly transmitting an equalization processing command, a voltage transmission command, and a selection command to the command reception unit 5 described above. This command transmission unit 15 dispatches the equalization processing command, the voltage transmission command, and the selection command as radio waves (i.e., transmission waves) using the antenna for communication described above. Such a command transmission unit 15 includes a predetermined modulation circuit and generates transmission waves by performing modulation processing of the equalization processing command on the basis of a communication protocol determined in advance.

The data transmission unit 16 is a communication unit for transmitting various kinds of data other than the equalization processing command, the voltage transmission command, and the selection command described above, namely, data necessary for each of the voltage detection devices A1 to An. This data transmission unit 16 dispatches various kinds of data other than the equalization processing command, the voltage transmission command, and the selection command described above, as radio waves (i.e., transmission waves) using the antenna for communication described above. Similar to the command transmission unit 15, this data transmission unit 16 includes a predetermined modulation circuit and generates transmission waves by performing modulation processing of the data and the identification number on the basis of a communication protocol determined in advance.

Next, an operation of selecting information transmission paths in the battery monitoring system according to the present embodiment will be described in detail with reference to FIG. 3.

Figure 3:
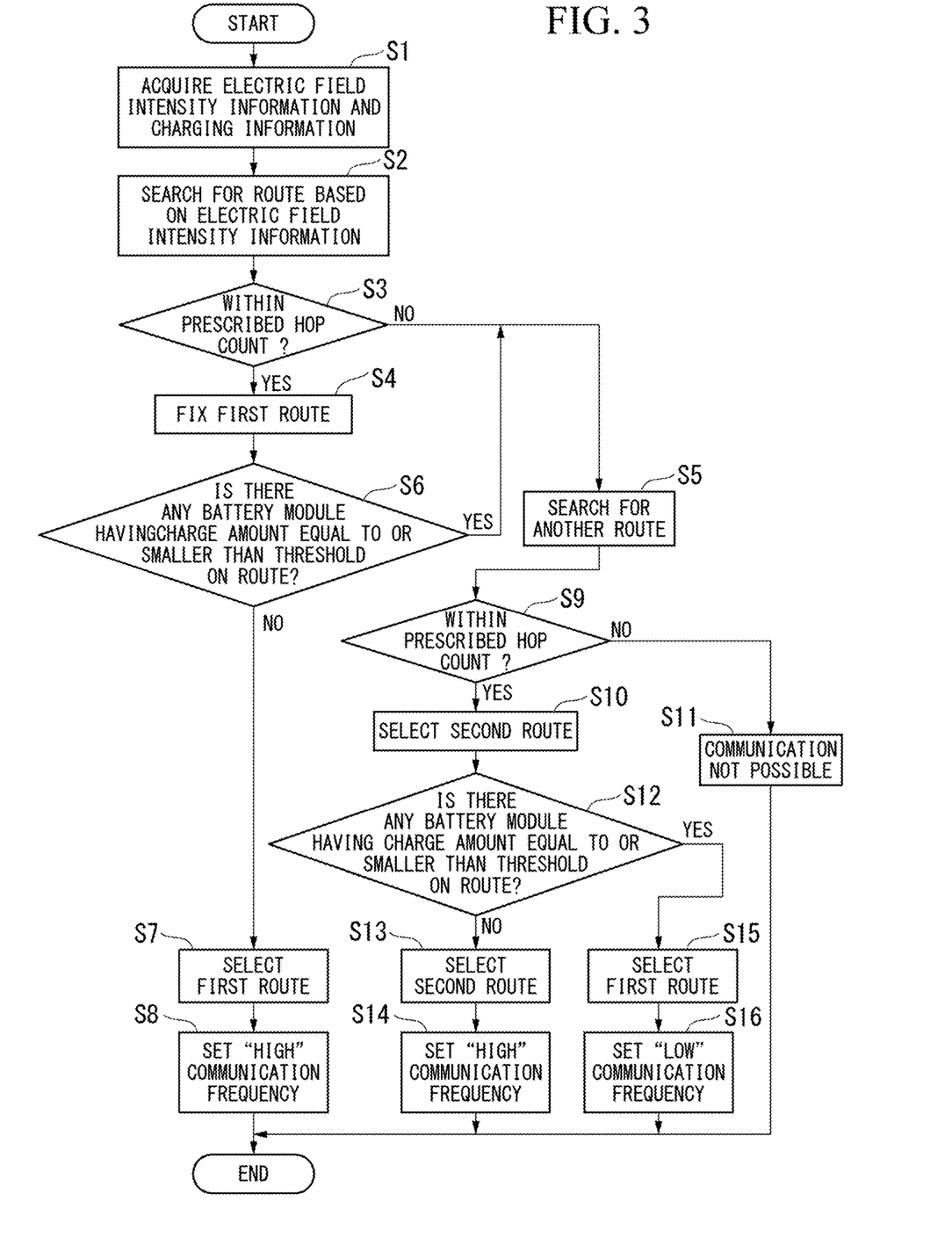
FIG. 3 is a flowchart for describing an operation of selecting information transmission paths of the battery monitoring system according to the first embodiment of the present invention.

FIG. 3 is a flowchart for describing an operation of selecting information transmission paths. An operation of selecting information transmission paths is processing for making the selection command described above and is performed by the path selection unit 13.

The path selection unit 13 first acquires the electric field intensity information and the charging information (Step S1). Here, the path selection unit 13 acquires, as the charging information, the charge amounts of the battery modules M1 to Mn which are calculated by the charge amount calculation unit 12 and stored in the storage unit 11, and acquires, as the electric field intensity information, the electric field intensity values stored in the storage unit 11.

Subsequently, the path selection unit 13 searches for a route based on the electric field intensity information (Step S2). Here, with respect to each of the voltage detection devices A1 to An, information transmission paths are searched for by selecting a route such that the electric field intensity value becomes the largest between the voltage detection devices A1 to An (or between the voltage detection devices A1 to An and the monitoring device B).

Subsequently, the path selection unit 13 judges whether or not the information transmission paths obtained in Step S2 are within a prescribed hop count set in advance (Step S3). Here, a hop count indicates the number of other voltage detection devices A1 to An through which communication is performed between a certain voltage detection device of the voltage detection devices A1 to An and the monitoring device B. The prescribed hop count is set in advance to a hop count at which a required communication speed or the like can be satisfied, and is stored in advance in the storage unit 11, for example.

When the information transmission paths obtained in Step S2 are within the prescribed hop count set in advance, the path selection unit 13 fixes the information transmission paths obtained in Step S2 as a first route (Step S4). On the other hand, when the information transmission paths obtained in Step S2 are not within the prescribed hop count set in advance, the path selection unit 13 searches for another route different from the information transmission paths obtained in Step S2 (Step S5).

When the first route is fixed in Step S4, the path selection unit 13 judges whether or not there is any of the battery modules M1 to Mn connected to the voltage detection devices A1 to An forming the first route and having a charge amount equal to or smaller than the threshold (Step S6). When there is any of the battery modules M1 to Mn having a charge amount equal to or smaller than the threshold in Step S6, the path selection unit 13 shifts to Step S5 and searches for another route different from the information transmission paths obtained in Step S2.

When there is not any of the battery modules M1 to Mn having a charge amount equal to or smaller than the threshold in Step S6, the first route is selected as the information transmission paths for transmission to the voltage detection devices A1 to An (Step S7), and also sets a "high" communication frequency using the first route (Step S8). For example, a "high" communication frequency denotes that an interval for transmitting and receiving communication information is shorter than that when the communication frequency (which will be described below) is "low".

When the path selection unit 13 shifts to Step S5 and searches for another route, the path selection unit 13 judges whether or not the information transmission paths obtained in Step S5 are within the prescribed hop count set in advance (Step S9). Here, when the information transmission paths obtained in Step S5 are within the prescribed hop count set in advance, the path selection unit 13 fixes the information transmission paths obtained in Step S5 as a second route (Step S10). On the other hand, when the information transmission paths obtained in Step S5 are not within the prescribed hop count set in advance, the path selection unit 13 judges that communication cannot be performed (Step S11) and ends the operation of selecting information transmission paths.

When the second route is fixed in Step S10, the path selection unit 13 judges whether or not there is any of the battery modules M1 to Mn connected to the voltage detection devices A1 to An forming the second route and having a charge amount equal to or smaller than the threshold (Step S12).

When there is not any of the battery modules M1 to Mn having a charge amount equal to or smaller than the threshold in Step S12, the second route is selected as the information transmission paths for transmission to the voltage detection devices A1 to An (Step S13), and also sets a "high" communication frequency using the second route (Step S14).

When there is any of the battery modules M1 to Mn having a charge amount equal to or smaller than the threshold in Step S12, the path selection unit 13 selects the first route as information transmission paths for transmission to the voltage detection devices A1 to An (Step S15), and also sets a "low" communication frequency using the first route (Step S16). For example, a "low" communication frequency denotes that the interval for transmitting and receiving communication information is restricted to the lowest level and the communication interval is longer than that when the communication frequency is "high". In this manner, electricity consumption of the battery modules M1 to Mn can be restricted by setting a "low" communication frequency.

The path selection unit 13 executes the operation of selecting information transmission paths described above for each of the voltage detection devices A1 to An and selects the voltage detection devices A1 to An forming information transmission paths for each of the voltage detection devices A1 to An.

Figure 4A:
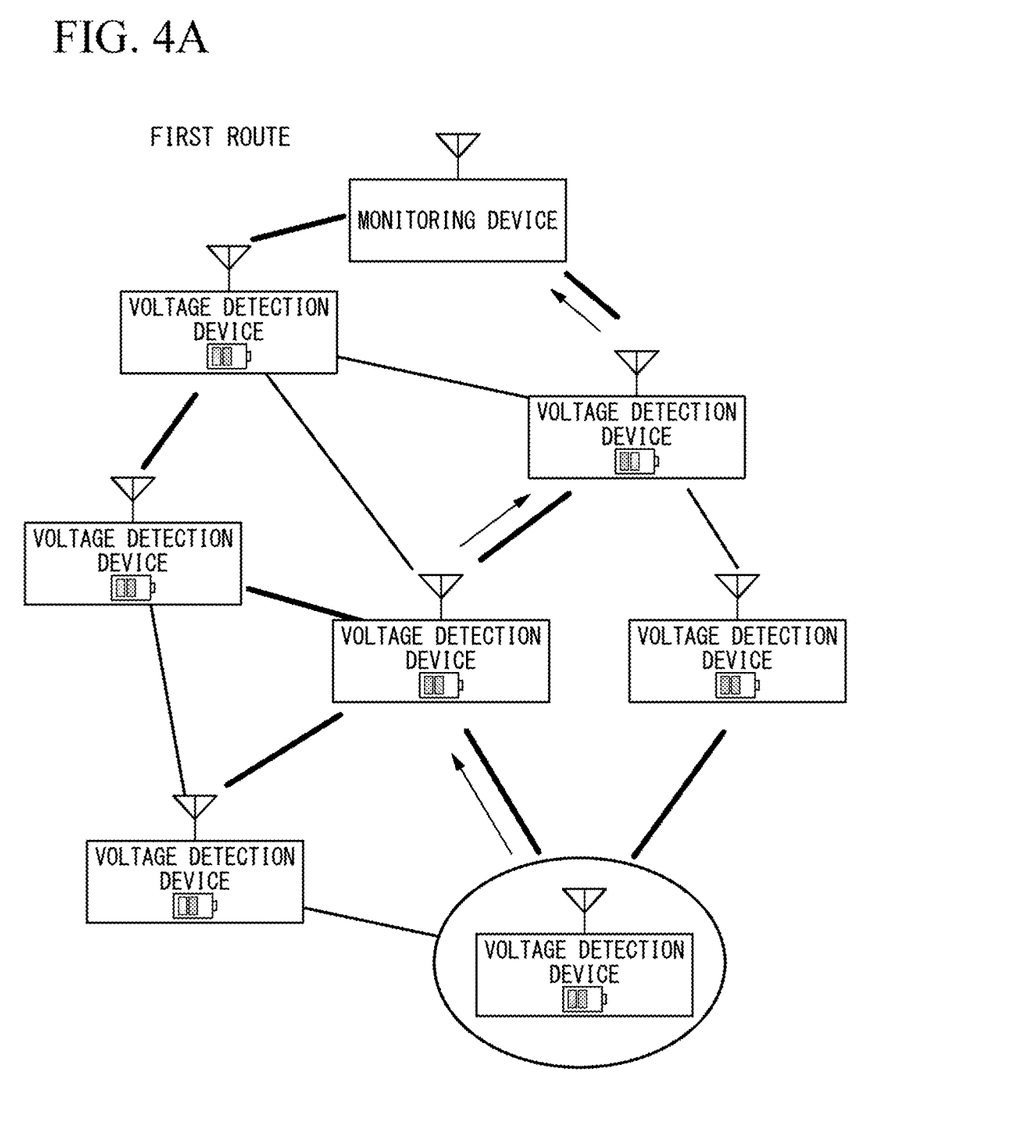
FIG. 4A is a schematic conceptual diagram for describing a first route.
Figure 4B:
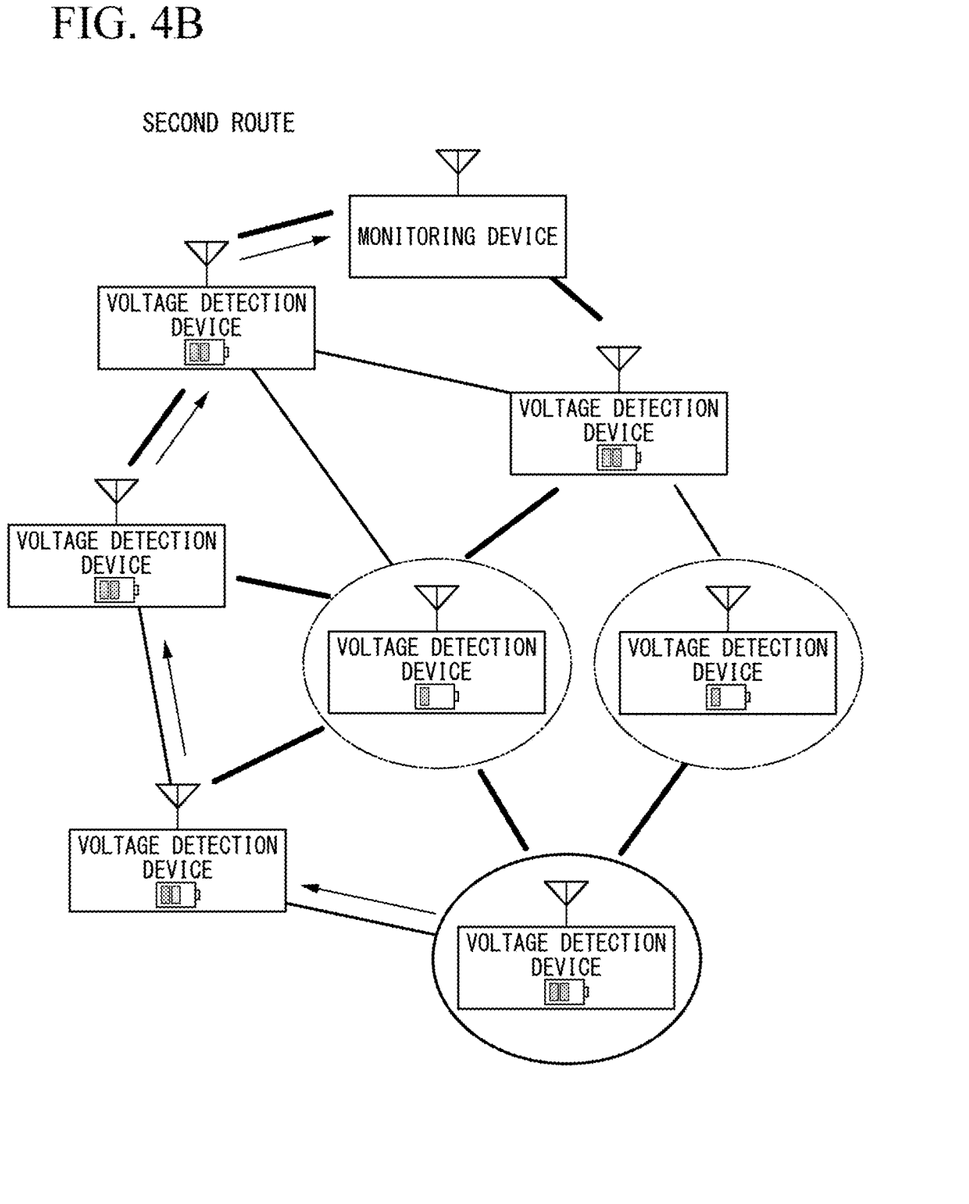
FIG. 4B is a schematic conceptual diagram for describing a second route.

FIG. 4A is a schematic conceptual diagram for describing the foregoing first route, and FIG. 4B is a schematic conceptual diagram for describing the foregoing second route. In FIG. 4A and FIG. 4B, the numbers of graduations inside battery marks indicate battery residual quantities (that is, the charge amounts) of the battery modules. In addition, in FIG. 4A and FIG. 4B, the thicknesses of the lines connecting the voltage detection devices to each other or the voltage detection devices and the monitoring device to each other indicate degrees of the electric field intensities. In addition, in FIGS. 4A and FIG. 4B, the arrows indicate the information transmission paths.

As shown in FIG. 4A, in the first route, a voltage detection device is selected such that paths having high electric field intensities become the information transmission paths. On the other hand, as shown in FIG. 4B, when the battery residual quantities of the battery modules connected to the voltage detection devices which have formed the first route are low, the second route is formed to avoid the voltage detection devices connected to these battery modules having low battery residual quantities.

As in Steps S12, S15, and S16, when the voltage detection devices A1 to An connected to the battery modules M1 to Mn having low charge amounts are used as information transmission paths, the communication frequency is decreased. Namely, in the present embodiment, when the charge amounts of the battery modules M1 to Mn connected to the voltage detection devices A1 to An forming information transmission paths are smaller than the threshold set in advance, the communication frequency of communication via these information transmission paths is decreased compared to a case in which the charge amounts of the battery modules M1 to Mn connected to the voltage detection devices A1 to An forming information transmission paths is larger than the threshold set in advance.

The foregoing battery monitoring system of the present embodiment includes the voltage detection devices A1 to An that are provided for the plurality of respective battery modules M1 to Mn, acquire the charging information of the battery modules M1 to Mn, and form information transmission paths for the charging information through radio communication therebetween; the monitoring device B that monitors the battery modules M1 to Mn on the basis of the charging information input via the information transmission paths; and the path selection unit 13 that selects the voltage detection devices A1 to An forming information transmission paths to the monitoring device B for each of the voltage detection devices A1 to An on the basis of the charging information. In the present embodiment, the path selection unit 13 is embedded in the monitoring device B as a function of the monitoring device B. In addition, in the battery monitoring method of the present embodiment, information transmission paths from the voltage detection devices A1 to An provided for the plurality of respective battery modules M1 to Mn to the monitoring device B for monitoring the battery modules M1 to Mn are formed through radio communication between the voltage detection devices A1 to An, the charging information of the battery modules M1 to Mn is acquired, and the voltage detection devices A1 to An forming information transmission paths are selected for each of the voltage detection devices A1 to An on the basis of the charging information.

In such a battery monitoring method for a battery monitoring system of the present embodiment, a mesh network for connecting each of the voltage detection devices A1 to An and the monitoring device B to each other is formed through radio communication between the voltage detection devices A1 to An. In addition, in the battery monitoring system of the present embodiment, the voltage detection devices A1 to An forming information transmission paths from each of the voltage detection devices A1 to An to the monitoring device B are selected on the basis of the charged states of the battery modules M1 to Mn acquired by the voltage detection devices A1 to An. That is, the path selection units 13 judges whether or not each of the voltage detection devices A1 to An provided with the path selection unit 13 can form information transmission paths on the basis of the charged states of the battery modules M1 to Mn acquired by the voltage detection devices A1 to An to select an information transmission path. Namely, according to the battery monitoring system of the present embodiment, the information transmission paths can be formed in consideration of the charged states of the battery modules M1 to Mn. For example, information transmission paths can be formed such that no variation occurs in the charge amounts of the battery modules M1 to Mn.

In addition, in the battery monitoring system of the present embodiment, when the charge amounts of the battery modules M1 to Mn connected to the voltage detection devices A1 to An forming information transmission paths are smaller than the threshold set in advance, the path selection unit 13 selects the voltage detection devices A1 to An forming information transmission paths excluding the voltage detection devices A1 to An connected to the battery modules M1 to Mn having charge amounts smaller than the threshold.

According to such a battery monitoring system of the present embodiment, information transmission paths are formed excluding the voltage detection devices A1 to An connected to the battery modules M1 to Mn having low charge amounts. For this reason, electricity of the battery modules M1 to Mn having low charge amounts can be prevented from decreasing due to communication.

In addition, in the battery monitoring system of the present embodiment, the path selection unit 13 selects the voltage detection devices A1 to An forming information transmission paths such that the number of the voltage detection devices A1 to An forming information transmission paths becomes an upper limit number set in advance or smaller (i.e., prescribed hop count or smaller). For this reason, according to the battery monitoring system of the present embodiment, occurrence of a communication delay or the like due to increase in the hop count can be restricted.

In addition, in the battery monitoring system of the present embodiment, when the charge amounts of the battery modules M1 to Mn connected to the voltage detection devices A1 to An forming information transmission paths are smaller than the threshold set in advance, the monitoring device B reduces the communication frequency of radio communication via the information transmission paths compared to a case in which the charge amounts of the battery modules M1 to Mn connected to the voltage detection devices A1 to An forming information transmission paths are larger than the threshold set in advance. For this reason, electricity of the battery modules M1 to Mn having low charge amounts can be prevented from decreasing due to communication.

In addition, in the battery monitoring system of the present embodiment, before the voltage detection devices A1 to An forming information transmission paths to the monitoring device B is selected on the basis of the charging information, the path selection unit 13 selects the voltage detection devices A1 to An forming information transmission paths to the monitoring device B on the basis of the electric field intensity of radio communication between the voltage detection devices A1 to An. For this reason, according to the present embodiment, information transmission paths can be formed on the basis of paths having high electric field intensities.

Second Embodiment

Next, a second embodiment of the present invention will be described. In the present embodiment, description for parts similar to those in the foregoing first embodiment will be omitted or simplified.

Figure 5:
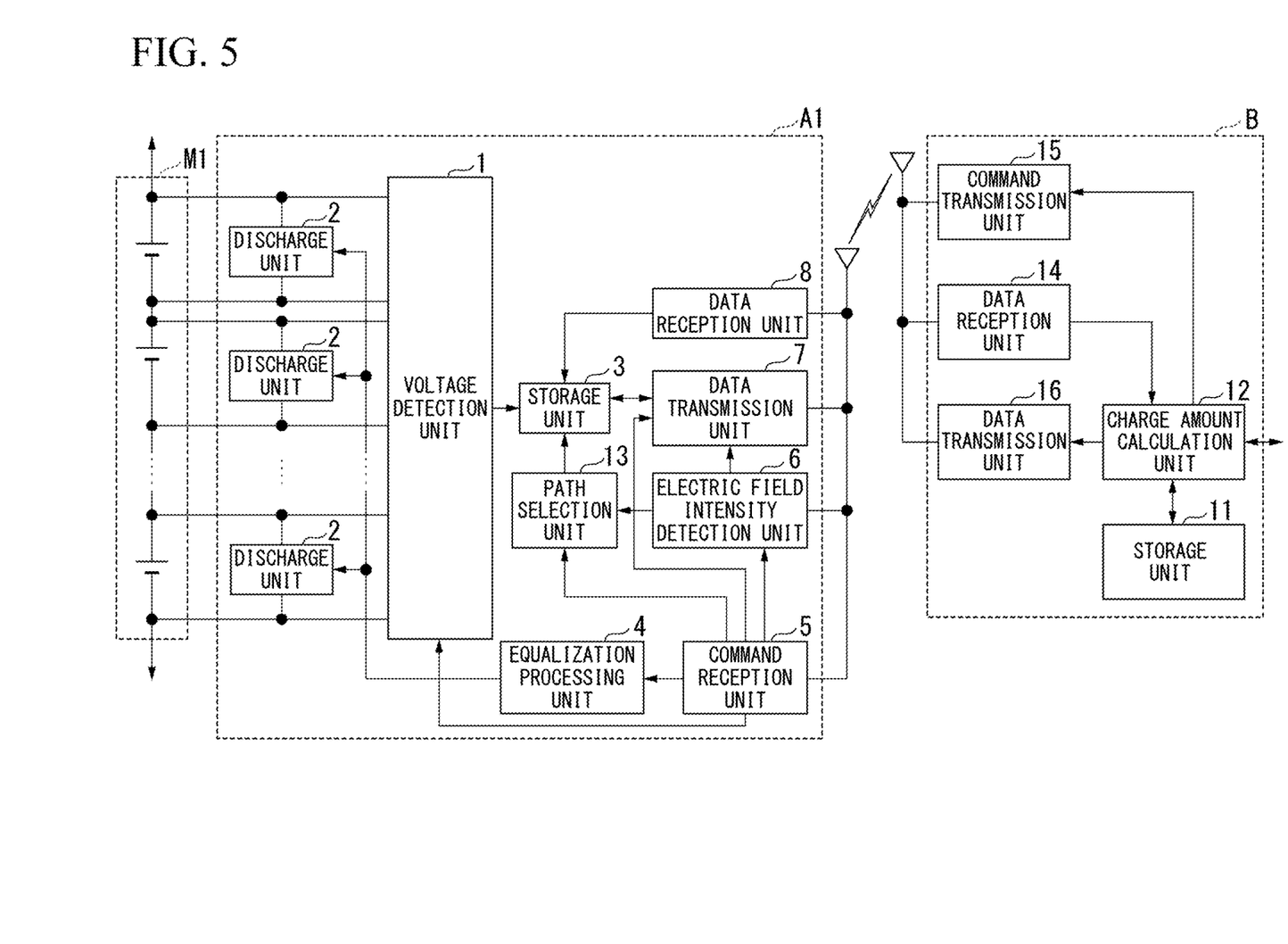
FIG. 5 is a detailed block diagram including the voltage detection device and the monitoring device provided in a battery monitoring system according to a second embodiment of the present invention.

FIG. 5 is a block diagram including the voltage detection device and the monitoring device provided in a battery monitoring system according to the present embodiment. As shown in this diagram, in the present embodiment, the path selection unit 13 is provided as a function of the first voltage detection device A1. The path selection unit 13 is also provided in other voltage detection devices A2 to An in addition to the first voltage detection device A1.

In the present embodiment, for example, information transmission paths are formed with cooperation of a plurality of path selection units 13 provided in respective ones of the plurality of voltage detection devices A1 to An through communication therebetween. For example, each path selection unit 13 of the plurality of path selection units 13 acquires the charging information (i.e., cell voltage detection value) and judges whether or not the voltage detection devices A1 to An provided with the path selection unit 13 itself can form information transmission paths on the basis of this charging information. When it is judged that the voltage detection devices A1 to An provided with the path selection unit 13 itself can form information transmission paths, the path selection units 13 select the voltage detection devices A1 to An which are physically closer to the monitoring device B and have higher electric field intensity values as transmission destinations for the information on the basis of the electric field intensity values. When these are executed by each of the path selection units 13 provided in respective ones of the voltage detection devices A1 to An, information transmission paths are formed with respect to the voltage detection devices A1 to An.

For example, the path selection units 13 can acquire the charge amounts of the battery modules M1 to Mn by calculating the charge amounts of the battery modules M1 to Mn on the basis of the cell voltage detection values stored in the storage unit 11. In addition, the path selection unit 13 may acquire the charge amounts of the battery modules M1 to Mn from the charge amount calculation unit 12 of the monitoring device B.

Also in the present embodiment, information transmission paths can be formed in consideration of the charged states of the battery modules M1 to Mn. For example, information transmission paths can be formed such that no variation occurs in the charge amounts of the battery modules M1 to Mn.

Third Embodiment

Next, a third embodiment of the present invention will be described. In the present embodiment, description for parts similar to those in the foregoing first embodiment will be omitted or simplified.

Figure 6:
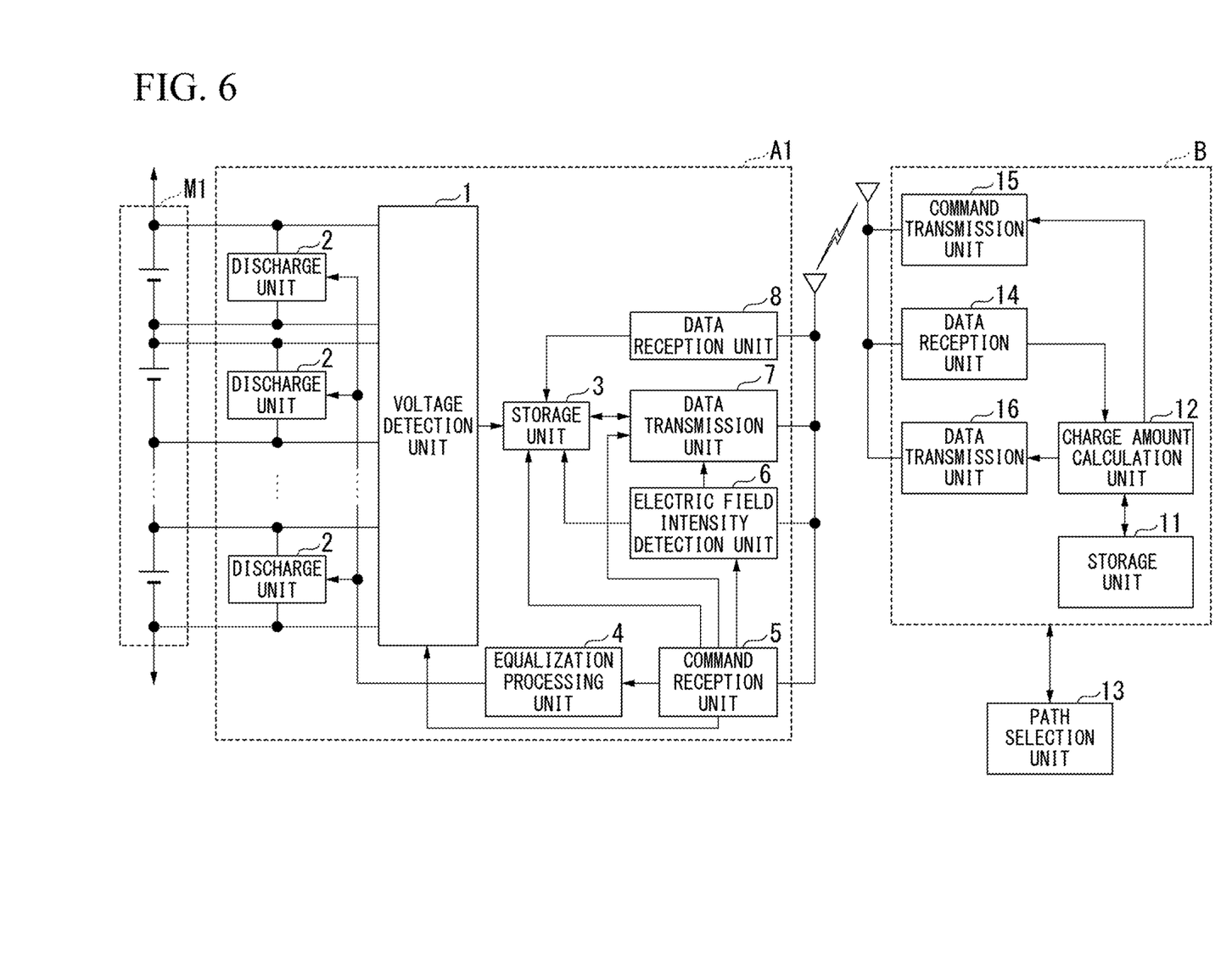
FIG. 6 is a detailed block diagram including the voltage detection device and the monitoring device provided in a battery monitoring system according to a third embodiment of the present invention.

FIG. 6 is a block diagram including the voltage detection device and the monitoring device provided in a battery monitoring system according to the present embodiment. As shown in this diagram, in the present embodiment, the path selection unit 13 is provided outside the monitoring device B and is connected to the monitoring device B.

For example, such a path selection unit 13 is provided as a function of an engine control unit (i.e., ECU) and selects the voltage detection devices A1 to An forming information transmission paths while communicating with the monitoring device B.

Also in the present embodiment, information transmission paths can be formed in consideration of the charged states of the battery modules M1 to Mn. For example, information transmission paths can be formed such that no variation occurs in the charge amounts of the battery modules M1 to Mn.

The host control device, the voltage detection unit 1, the equalization processing unit 4, the electric field intensity detection unit 6, the charge amount calculation unit 12, and the path selection unit 13, are realized by a computer processor such as a central processing unit (CPU) executing a program (software). Some or all of such constituent elements may be realized by hardware (a circuit unit; including circuitry) such as a large scale integration (LSI), an application specific integrated circuit (ASIC), a field-programmable gate array (FPGA), a graphics processing unit (GPU), or the like or may be realized by software and hardware in cooperation. The program may be stored in a memory such as the storage unit 3 in advance or may be stored in a storage medium such as a DVD or a CD-ROM that can be loaded or unloaded and installed in the storage unit 3 by loading the storage medium in a drive device. The CPU and the memory may be provided in a server connected to a network.

Hereinabove, preferable embodiments of the present invention have been described with reference to the accompanying drawings, but the present invention is not limited to the foregoing embodiments. All the shapes, combinations, and the like of the constituent members illustrated in the embodiments described above are examples, and various changes can be made on the basis of requirement of design or the like within a range not departing from the gist of the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A battery monitoring device comprising:
a plurality of charged state acquisition units that are provided with respective ones of a plurality of battery modules, acquire charging information of the plurality of battery modules, and are capable of forming an information transmission path for the charging information through radio communication therebetween;
a monitoring unit that monitors the plurality of battery modules on the basis of the charging information input via the information transmission path; and
a path selection unit that selects a charged state acquisition unit forming the information transmission path from the plurality of charged state acquisition units to the monitoring unit on the basis of the charging information, in a mesh network including radio lines connecting among the plurality of charged state acquisition units and radio lines connecting between the plurality of charged state acquisition units and the monitoring unit.

2. The battery monitoring device according to claim 1, wherein the path selection unit
selects the charged state acquisition unit forming the information transmission path such that a charged state acquisition unit connected to a battery module having a charge amount smaller than a threshold set in advance
among the plurality of battery modules each of which is connected to the charged state acquisition unit forming the information transmission path is excluded.

3. The battery monitoring device according to claim 1, wherein the path selection unit selects the charged state acquisition unit forming the information transmission path such that the number of a plurality of the charged state acquisition units forming the information transmission path becomes an upper limit number set in advance or smaller.

4. The battery monitoring device according to claim 1, wherein when there is a battery module having a charge amount smaller than a threshold set in advance among the plurality of battery modules each of which is connected to the charged state acquisition unit forming the information transmission path,
the monitoring unit reduces a communication frequency of the radio communication via the information transmission path compared to that in a case in which the charge amount of the battery module is larger than the threshold set in advance.

5. The battery monitoring device according to claim 1, wherein before the charged state acquisition unit forming the information transmission path to the monitoring unit is selected on the basis of the charging information,
the path selection unit selects the charged state acquisition unit forming the information transmission path on the basis of an electric field intensity of the radio communication between the plurality of charged state acquisition units capable of forming the information transmission path.

6. The battery monitoring device according to claim 1, wherein the path selection unit is configured to
select the charged state acquisition unit forming the information transmission path on the basis of an electric field intensity of the radio communication between the plurality of charged state acquisition units capable of forming the information transmission path,
limit a number of the charged state acquisition units so as to be equal to or smaller than a predetermined hop count, and
select the charged state acquisition unit forming the information transmission path so as to exclude a charged state acquisition unit connected to a battery module having a charge amount smaller than a threshold set in advance.

7. A battery monitoring method for forming an information transmission path from each of a plurality of charged state acquisition units to a monitoring unit monitoring a plurality of battery modules through radio communication between the plurality of charged state acquisition units provided with respective ones of a plurality of battery modules, the battery monitoring method comprising:
acquiring charging information of the plurality of battery modules; and
selecting a charged state acquisition unit forming the information transmission path from the plurality of charged state acquisition units to the monitoring unit on the basis of the charging information , in a mesh network including radio lines connecting among the plurality of charged state acquisition units and radio lines connecting between the plurality of charged state acquisition units and the monitoring unit.

8. The battery monitoring method according to claim 7, wherein a process of selecting the charged state acquisition unit forming the information transmission path includes
selecting the charged state acquisition unit forming the information transmission path on the basis of an electric field intensity of the radio communication between the plurality of charged state acquisition units capable of forming the information transmission path,
limiting a number of the charged state acquisition units so as to be equal to or smaller than a predetermined hop count, and
selecting the charged state acquisition unit forming the information transmission path so as to exclude a charged state acquisition unit connected to a battery module having a charge amount smaller than a threshold set in advance.

* * * * *